United States Patent
Kuroda

(10) Patent No.: US 6,335,911 B1
(45) Date of Patent: Jan. 1, 2002

(54) INFORMATION RECORDING METHOD AND APPARATUS

(75) Inventor: Kazuo Kuroda, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/478,543

(22) Filed: Jan. 6, 2000

(30) Foreign Application Priority Data

Jan. 8, 1999 (JP) .......................................... 11-002377

(51) Int. Cl.⁷ ............................. G11B 3/90; G11B 17/22
(52) U.S. Cl. ........................ 369/53.2; 369/59.1; 369/32
(58) Field of Search ............................. 369/59.1, 53.2, 369/47.1, 47.15, 47.16, 53.1, 53.11, 60.01, 275.3, 32, 33, 53.41; 386/112, 109, 125, 70, 95

(56) References Cited

U.S. PATENT DOCUMENTS 5,805,550 A * 9/1998 Ohmori ........................ 369/58
5,923,627 A * 7/1999 Miwa et al. ................... 369/47

* cited by examiner

Primary Examiner—Ali Neyzari
(74) Attorney, Agent, or Firm—Sughrue Mion, PLLC

(57) ABSTRACT

An information recording method, in which when new digital information is employed to update a part of old digital information that has been divided into ECC blocks and stored on an information recording medium, the latest update position for the old digital information that is to be updated is detected based on the volume of the data of the new digital information. A predetermined volume for the old digital information that has been stored sequentially following the latest update position detected is read, and then, at least a part of the old digital information that has been read is recorded after the new digital information is recorded, so that the destruction of data that should not be rewritten can be prevented at the portion whereat the old digital information is coupled with the new digital information. As a result, the deterioration of the error correction capability for the coupled portion can be reduced.

7 Claims, 5 Drawing Sheets

INFORMATION RECORDING METHOD AND APPARATUS

BACKGROUND OF THE INVENTION

1. Field of the Invention

The present invention relates to an information recording method for writing over old digital information previously recorded on a recording medium, such as a phase-change optical disk for which the updating and the recording of data (hereinafter referred to as overwriting) can be performed, and also relates to an information recording apparatus for performing the above method.

2. Description of the Related Art

Generally, digital information that is to be recorded on a recording medium, such as an optical disk, is formed into information blocks, the volume of each of which corresponds to that of an error correction unit, such as an ECC (Error Correcting Code) block in an error correction process. ID information is added at the head of each information block to serve as address information on the recording medium. Therefore, when the above error correction unit is used to record new information over part of the information previously recorded on a rewritable recording medium, based on the ID information, a search is made for the first position occupied by the previously recorded digital information that is to be overwritten, and beginning at that first position, the overwriting of data is performed by the error correction unit.

Normally, a recording medium, such as an optical disk, is moved (rotated, when speaking of an optical disk) at a predetermined speed relative to an optical pickup for recording/reproducing digital information. The digital information is recorded at specific locations on the recording medium, based on a recording clock that is synchronized with the predetermined speed.

However, if the volume of the digital information to be recorded is M times (M is an integer of 1 or greater) that of the above-mentioned predetermined error correction block, due to the poor rotational control available with an optical disk, adequate positional accuracy can not be obtained when overwriting digital information. Thus, part of the data at the end of the information used to rewrite an information block may be so recorded that it overlaps and changes a portion of a succeeding block that should not be rewritten, i.e., the first portion of the succeeding information block wherein address information and ID information, such as a sync signal, are generally recorded. Since the ID information is used as control information when a recording/reproducing device exercises movement control, stable recording/reproducing control can not be performed if the ID information is destroyed by the rewriting operation.

Conventionally, therefore, when information is being rewritten, to prevent the overwriting and destruction of ID information, which should not be rewritten, at the head of the next information block, i.e., the information block that immediately follows the one that is to be rewritten, the aforementioned ID information and dummy data for which error correction can be performed are newly generated, and are added at the end of the new digital information that is to be recorded. Further, to standardize the updating/recording process, information obtained by excluding the ID information and the dummy data that is to be written at the head of the following information block is employed as the new digital information, and the updating and recording of information in the target information block is effected, beginning at a position following data previously recorded in the head portion of the block, ID information and other information that is written at a location originally occupied by dummy data.

That is, conventionally, the head portion of the information block that is to be rewritten is not changed, but ID information and newly generated dummy data are written in the head portion of the following information block, which should not be rewritten.

Since dummy data constitutes all the information in an information block for which the performance of error correction is permitted, the original data can be recovered by performing error correction. However, dummy data or old digital information, i.e., data differing from that which should be included, is present in the information block beginning at the position whereat new digital information and old digital information are coupled together (the first ECC block of new digital information and another ECC block, following the final ECC block of the new digital information, in which old digital information is recorded). Therefore, the capability of performing an error correction process for the information block at the coupled portion is deteriorated. That is, since the correction capability (e.g., the number of correctable words) for an information block as an error correction unit is determined in advance, if erroneous dummy data or old digital information is present at the beginning, errors that occur due to an original factor, such as a scratch on a disk, can not be corrected at the same time as time errors due to the dummy data and the old digital information are corrected.

SUMMARY OF THE INVENTION

To resolve the above shortcomings, it is an object of the present invention to provide an information recording method for reducing, during an overwriting process, the deterioration of the error correction capability for an information block at a coupled portion, and also to provide an information recording apparatus for performing the above method.

To achieve the above object, according to the present invention, there is provided an information recording method, whereby new digital information is employed to update a part of old digital information that has been recorded on an information recording medium and that has been separated by adding for each error correction unit control information that has been determined in advance, comprising: a latest update location detection step of employing the volume of the new digital information to detect the latest update position on the recording medium for the old digital information that is to be updated; an information reading step of reading a predetermined volume of old digital information that has been recorded following the latest update position detected; and a recording step of sequentially recording, following the recording of the new digital information, a part, which at least includes the control information, of the predetermined volume of the old digital information that has been read at the information reading step.

According to the present invention, at the latest update location detection step, before the updating and the recording of the new digital information are performed, the latest update location of the old digital information that is to be updated is detected. Then, at the information reading step, a predetermined volume of old digital information is read that was recorded at a succeeding position following the latest update location. In the updating and recording process, after the new digital information has been recorded, at least a portion of the old digital information that was read at the information reading step is recorded.

Therefore, instead of the conventional dummy data that is not related to the information that should have been recorded, the old digital information that should have originally been recorded is again recorded in the portion whereat the new, updated digital information and the old digital information are coupled together. Therefore, based on the old digital information that should have originally been recorded, it is possible to reduce the deterioration of the error correction capability for an ECC block that includes the above coupled portion for which error correction encoding has been performed.

Also, according to the present invention, there is provided an information recording apparatus, in which new digital information is employed to update a part of old digital information that has been recorded on an information recording medium and that has been separated by adding for each error correction unit control information that has been determined in advance, comprising: latest update location detection means for employing the volume of the new digital information to detect the latest update position on the recording medium for the old digital information that is to be updated; information reading means for reading a predetermined volume of old digital information that has been recorded following the latest update position detected; and recording means for sequentially recording, following the recording of the new digital information, a part, which at least includes the control information, of the predetermined volume of the old digital information that has been read by the information reading means.

BRIEF DESCRIPTION OF THE DRAWINGS

FIG. 1(a) is a diagram showing the structure of information to be recorded, and FIG. 1(b) is a diagram showing the structure of an ECC block.

DETAILED DESCRIPTION OF THE PREFERRED EMBODIMENT

Figure 1:
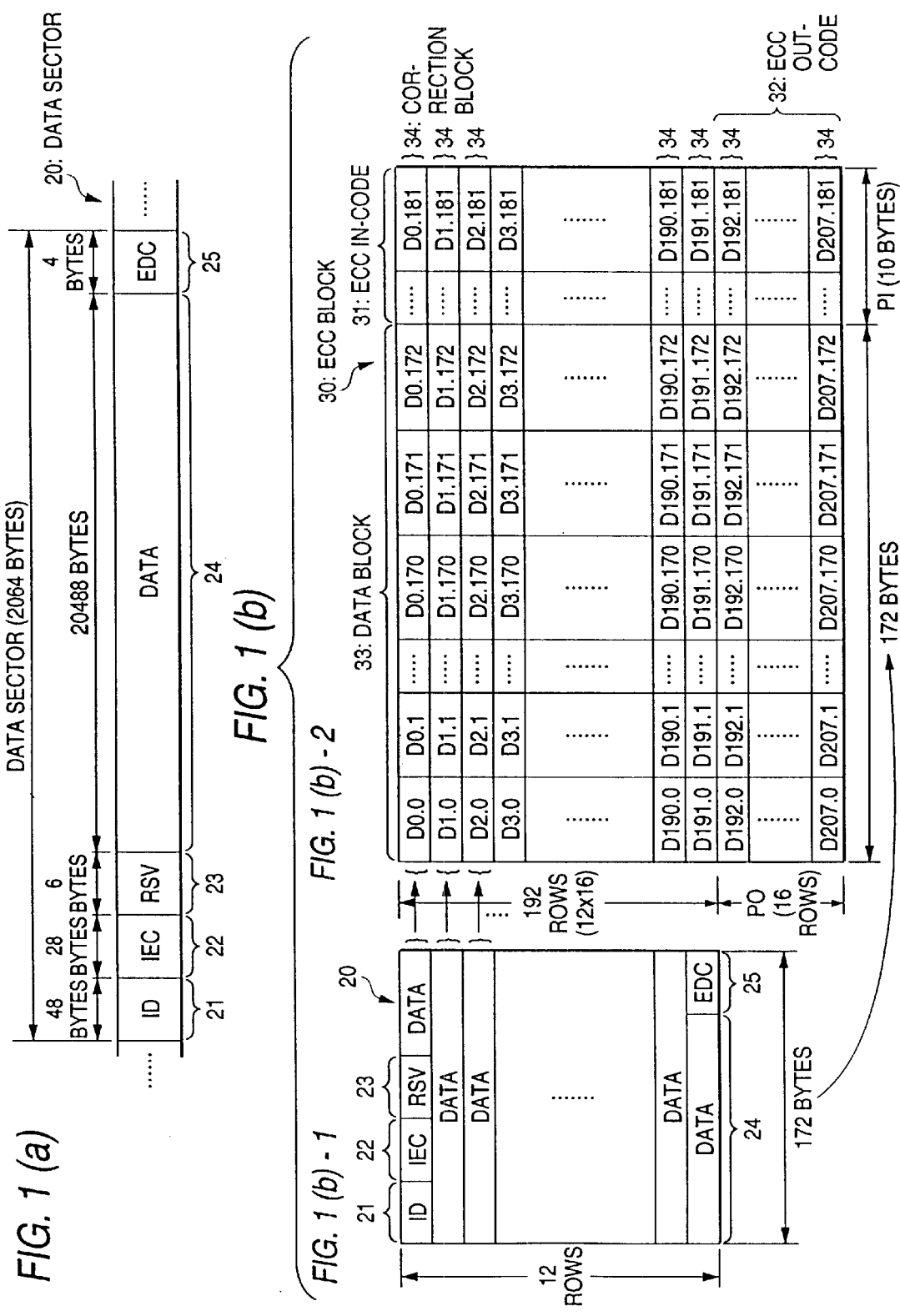
FIGS. 1(a) and 1(b) are diagrams showing the structure of an ECC block for information to be recorded according to an embodiment of the present invention.

The preferred embodiment of the present invention will now be described while referring to the drawings. In the following description, an information recording method according to the present invention is applied for a digital information recording apparatus that uses a DVD (Digital Versatile Disc) recording format to rewrite digital information on an optical disk made of a phase-change material.
(I) Recording Format The common physical format for recording digital information on a DVD, and an error correction process for the digital information will now be described while referring to FIGS. 1(a), 1(b) and 2.

First, an ECC block used as an error correction unit for this embodiment will be described while referring to FIGS. 1(a) and 1(b).

The physical structure used for digital information, which generally includes a plurality of data sectors 20, is shown in FIG. 1(a). A data sector 20 includes, beginning at the head, ID information 21, which indicates the starting position of the data sector 20; ID information error correction code (IEC (ID Data Error Correction Code)) 22, which is used to correct errors in the ID information 21; reserve data 23; main data 24, which is to be recorded; and an error detection code (EDC) 25, which is used to detect errors in the data 24. A plurality of sequential data sectors 20 are used for the digital information that is to be recorded.

The processing by which an ECC block is formed using data sectors 20 will now be described while referring to FIG. 1(b). To form an ECC block using the data sectors 20, first, as is shown in FIG. 1(b), one data sector 20 is divided into segments of 172 bytes each, and the obtained data segments (hereinafter referred to as data blocks 33) are arranged vertically (see FIG. 1(b)-1). At this time, 12 rows of data blocks 33 are provided.

Figure 2:
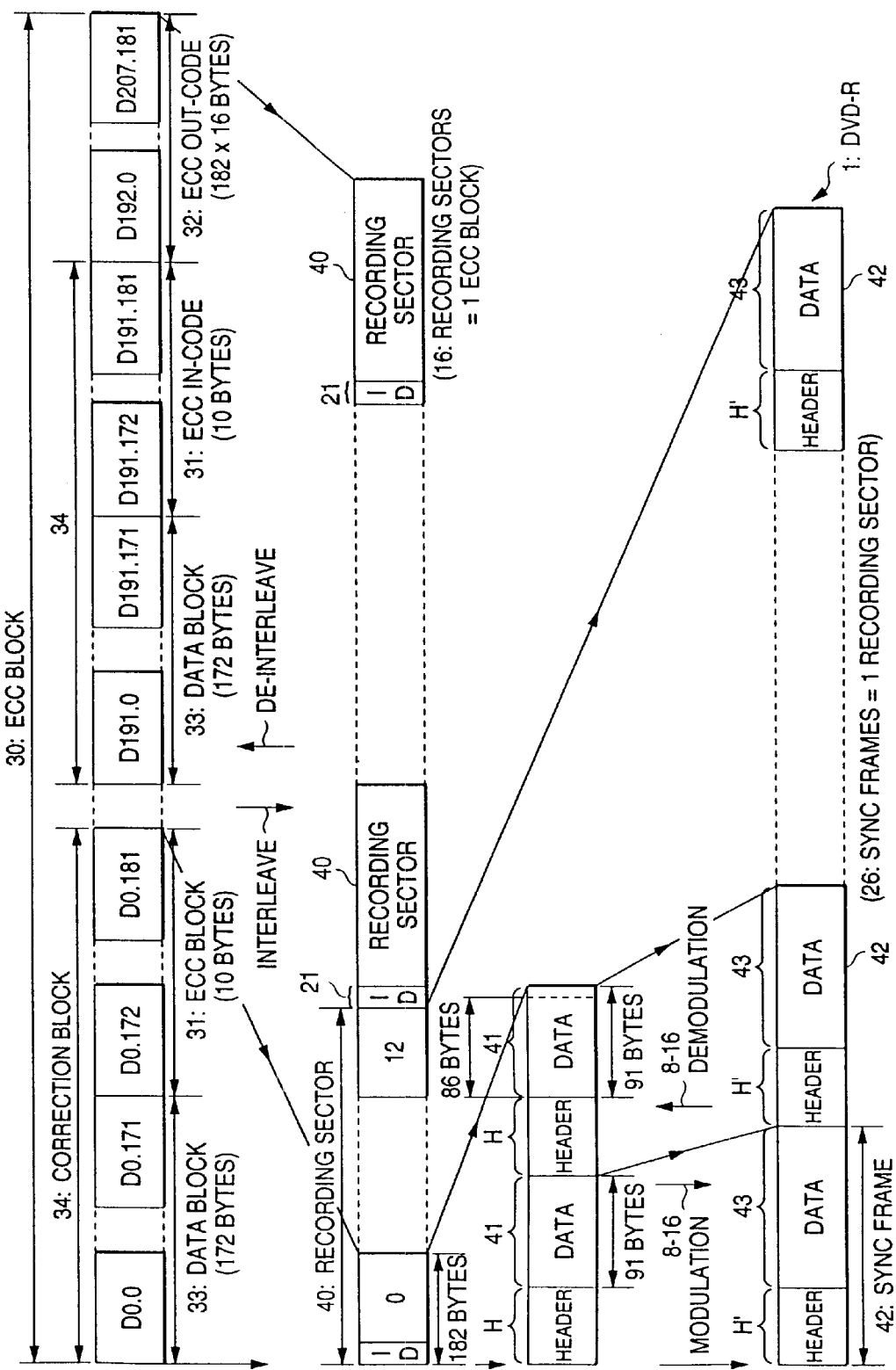
FIG. 2 is a diagram showing the physical format used for recorded information according to the embodiment of the present invention.

An ECC in-code (PI (Partly In) code) 31 of ten bytes is added at the end of each data block 33 to form a correction block 34 (see FIG. 1(b)-2). At this time, the correction blocks 34, to which the ECC in-code 31 has been added, are arranged in 12 rows. This process is repeated for 16 data sectors 20. In this manner, 192 rows of correction blocks 34 are obtained.

While the correction blocks 34 are arranged in 192 rows, they are vertically divided, from the beginning, into data segments, each of which is one byte wide, and 16 ECC out-codes (PO (Partly Out) codes) 32 are added to each of the obtained data segments, including each of the segments composed of the ECC in-codes 31 that are included in the correction blocks 34.

Through the above processing, one ECC block 30, including 16 data sectors 20, is formed as is shown in FIG. 1(b)-2. The total volume of the information in the ECC block 30 is:

(172+10) bytes×(192+16) rows=37856 bytes.

The actual data 24 are:

2048 bytes×16=32768 bytes.

In the ECC block 30 shown in FIG. 1(b)-2, one byte of date is represented by "D#.*". For example, "D1.0" represents one byte data located at the juncture of the first row and the 0-th column, and "D190.170" represents one byte data located at juncture of the 190th row and the 170th column. The ECC in-code 31 occupies locations ranging from the 172nd column to the 181st column, and the ECC out-code 32 occupies positions ranging from the 192nd row to the 207th row.

The correction blocks 34 are sequentially recorded on the optical disk. The ECC block 30 includes the ECC in-code 31 and the ECC out-code 32, as is shown in FIG. 1(b)-2, so that the ECC in-code 31 can be used to correct the data that are arranged horizontally in FIG. 1(b)-2, and the ECC out-code 32 can be used to correct data that are arranged vertically in FIG. 1(b)-2. That is, double error correction is performed vertically and horizontally in the ECC block 30 in FIG. 1(b)-2, thereby providing an error correction process for CDs (Compact Discs) that is superior to the conventional one.

More specifically, even if, for example, an entire correction block 34 (one block comprises 182 bytes, including the added ECC in-code 31, and 182 bytes of data are sequentially recorded on the optical disk) is destroyed due to a defect that occurs in the optical disk, when viewed in the vertical direction, in each column merely one byte of data is destroyed, relative to the ECC out-code 32 that is provided. Therefore, by using the ECC out-code 32 for each column, error correction can be performed and all the data can be precisely reproduced, even though the entire correction block 34 was destroyed.

A specific description will now be given, while referring to FIG. 2, of the process used for recording, on an optical disk, the data sectors 20 in the ECC block 30 in FIG. 1(b)-2. In FIG. 2, data represented by "D#.*" correspond to the data shown in FIG. 1(b)-2.

To record an ECC block 30 on an optical disk, first, as is shown at the top of the diagram in FIG. 2, the ECC block 30 is arranged horizontally as a row in which each correction block 34 is entered and interleaved, so that 16 recording sectors 40 are obtained. At this time, each recording sector 40 includes 2366 bytes of information (37856 bytes/16), and the data sector 20 and the ECC in-code 31 or the ECC out-code 32 coexist. The ID information 21 (see FIG. 1(a)) for the data sector 20 is located at the head of each recording sector 40.

Each of the recording sectors 40 is divided into data segments 41 of 91 bytes each, and a header H is added to each data segment 41. Then, 8–16 modulation is performed for the resultant recording sector 40, and one sync frame 42 is formed for each data segment 41. The sync frame 42 consists of a header H' and data 43. The volume of information contained in a sync frame 42 is:

91 bytes×8×(16/8)=1456 bits, and the sync frames 42 are sequentially written to the optical disk. Each of the recording sectors 40 includes 26 sync frames 42.

When information is recorded on the optical disk in accordance with the above-described physical format, the original ECC block 30 can be recovered by performing 8–16 demodulation and by de-interleaving the information during the reproducing process, and the information can then be precisely reproduced by performing the superior error correction process. (II) Digital Information Recording Apparatus.

A description will now be given, while referring to FIGS. 3 to 5, for a digital information recording apparatus, according to the embodiment of the present invention, that records digital information on an optical disk in accordance with the physical format described while referring to FIGS. 1(a), 1(b) and 2.

First, the arrangement of the digital information recording apparatus of the present invention will be described while referring to FIG. 3.

Figure 3:
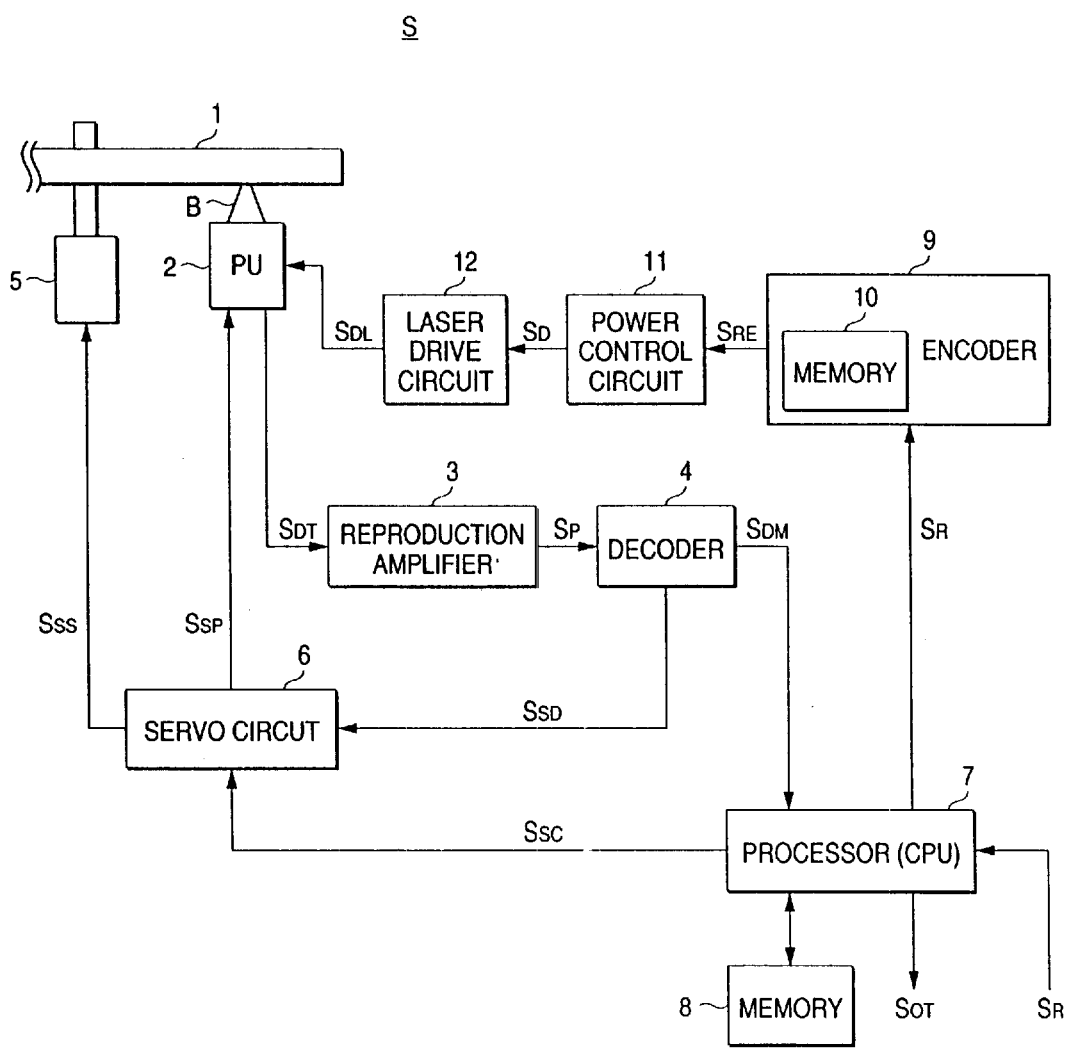
FIG. 3 is a schematic diagram showing the arrangement of an information recording apparatus.
Figure 4:
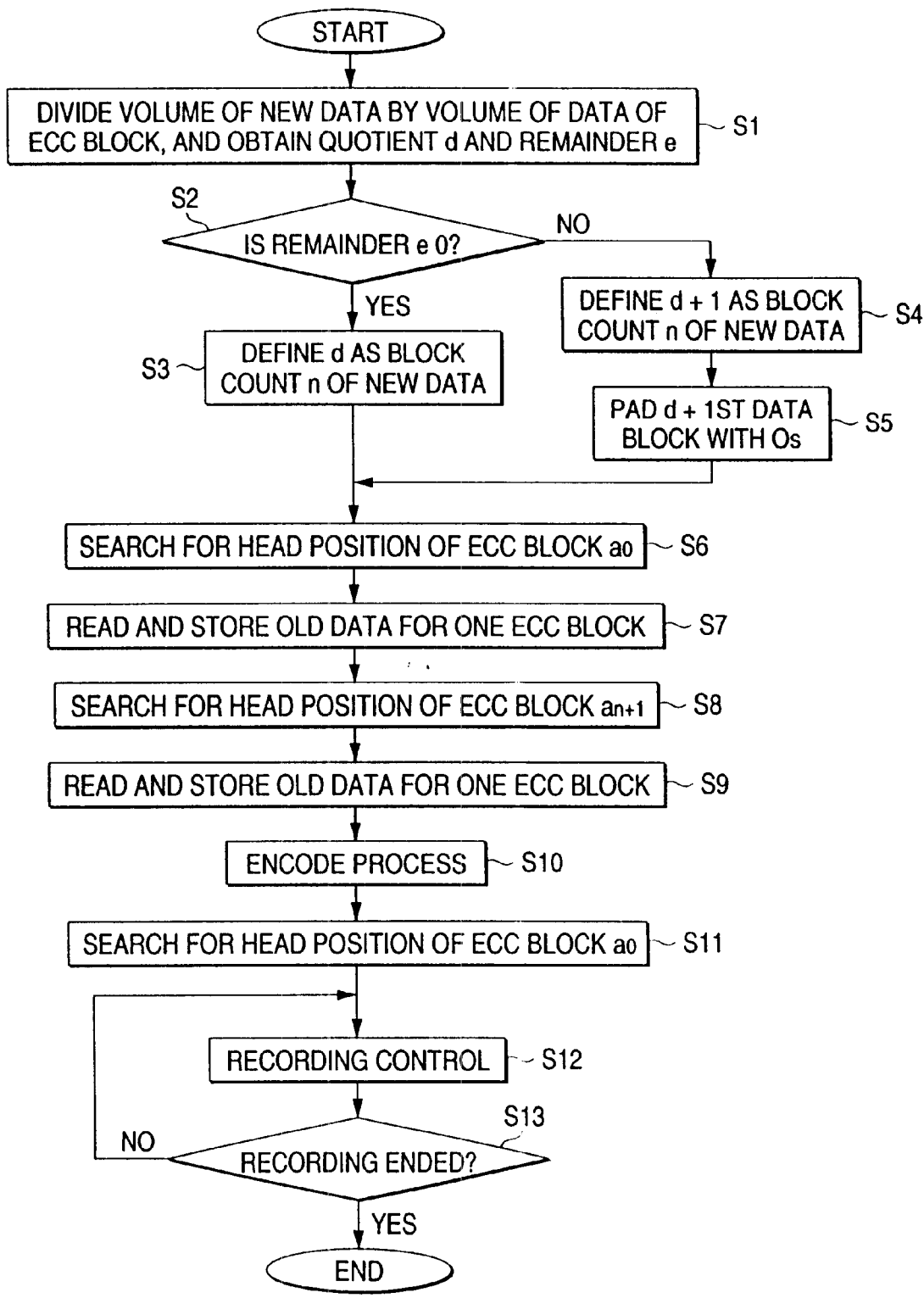
FIG. 4 is a flowchart showing the information recording processing.

In a digital information recording apparatus S according to the embodiment in FIG. 3, a pickup 2 includes a laser diode, a polarized beam splitter, an object lens and a photodetector (none of them shown). A light beam B having an intensity based on a laser drive signal SDL is projected onto the recording face of an optical disk 1 to record new digital information, and light that is reflected from the optical disk 1 is employed to detect old digital information that was previously recorded.

A reproduction amplifier 3 generates a signal $S_P$ by amplifying, to a signal level that is easy to handle in the following signal processing, a detection signal $S_{DT}$ that is output by the pickup 2 and that includes information corresponding to the old digital information that was previously recorded. The amplified signal $S_P$ is then output to a decoder 4.

The decoder 4 decodes the amplified signal $S_P$ by performing 8–16 demodulation, de-interleaving and error correction decoding, after which it outputs the obtained demodulation signal $S_{DM}$ to a processor 7 and a servo demodulation signal $S_{SD}$ to a servo circuit 6.

Based on the received servo demodulation signal $S_{DM}$, the servo circuit 6 outputs a pickup servo signal $S_{SP}$, which is used by the pickup 2 for servo control of focusing and tracking, and also outputs a spindle servo signal $S_{SS}$, which is used for servo control of the revolutions of a spindle motor 5 that rotates the optical disk 1.

In parallel with this processing, the processor 7 stores, in a memory 8, a recorded information signal $S_R$ that corresponds to new digital information that has been externally input for recording, and performs a recording process that will be described later. The processor 7 outputs the information to an encoder 9, and based on a demodulation signal $S_{DM}$, externally outputs a reproduction signal $S_{OT}$ that corresponds to old digital information that was previously recorded.

In accordance with a control signal from the processor 7, the encoder 9 performs error correction encoding by adding the ECC in-code 31 and the ECC out-code 32 to the recorded information signal $S_R$ stored in the memory 8, and constitutes the ECC block 30. Further, the encoder 9 generates an encode signal $S_{RE}$ by performing interleaving and 8–16 modulation for the ECC block 30, and outputs the encode signal $S_{RE}$ to a power control circuit 11.

Based on the encode signal $S_{RE}$, the power control circuit 11 outputs a drive signal $S_D$ to a laser drive circuit 12 to control the output of the laser diode (not shown) in the pickup 2.

Upon receiving the drive signal $S_D$, the laser drive circuit 12 drives the laser diode and outputs a laser drive signal $S_{DL}$ for the emission of a light beam B.

The information recording apparatus S can also reproduce information recorded on the optical disk 1. To reproduce information, a reproduction signal $S_{OT}$ is externally output via the processor 7 in accordance with the demodulation signal $S_{DM}$.

The digital information overwriting processing performed by the present invention will now be described while referring to FIGS. 4 and 5.

In this embodiment, ECC blocks $a_{-N}$ to $a_N$ are recorded as old digital information (hereinafter referred to as old data) on the optical disk 1. A description will be given for a case wherein ECC blocks $a_1$ to $a_n$ are overwritten using ECC blocks $b_1$ to $b_n$, which are new digital information (hereinafter referred to as new data). For the purposes of the description, assume that new data to be recorded on the optical disk 1 have already been supplied from the outside and stored in the memory 8.

In this processing, n is a numerical value obtained by dividing new data b into ECC blocks, and is an integer of 1 or greater. It should be noted that the volume of the new data b is not necessarily integer times the data volume of each ECC block. Therefore, if the volume of the new data b is not integer times the data volume of the ECC block, the remaining portion in the last block of the new data b is padded with 0s, so that in appearance the last block is an ECC block. For example, when the new data b is divided by the data volume of each ECC block and when the quotient is n−1 and the remainder is e, the number of ECC data blocks of the new data is n. The substantial data volume of the n-th ECC block data is e, and the remaining portion is padded with 0s. It should be noted that N is a natural number of n or greater.

When a command is entered at an operating unit (not shown) to begin overwriting starting with ECC block $a_1$, which is old data, the processor 7 calculates (using division)

how many times the data volume of each ECC block is the total volume of the new data b stored in the memory, and obtains quotient d and remainder e (step S1).

Then, at step S2, a check is performed to determine whether the remainder e at step S1 is 0. When the remainder e is 0, i.e., when the volume of the new data b is integer times the data volume of an ECC data block (step S2: yes), the quotient d is defined as data block count n of the new data b (step S3). Program control thereafter moves to step S6.

When at step S2 the remainder e is not 0 (step S2: no), a value (d+1), obtained by adding 1 to the quotient d, is defined as a data block count n of the new data b (step S4). Then, 0s are repeatedly stored in the memory 8 until the data volume of the new data b is equal to integer times n the data volume of the ECC block, i.e., a padding process is performed (step S5). Program control thereafter moves to step S6.

The processor 7 moves the pickup 2 from the first block (ECC block $a_1$ in this example) of old data to be updated, to a specific ECC block located to the rear relative to the recording direction, i.e., the first position of ECC block $a_0$ (step S6). The old data for one ECC block $a_0$ are read at the first position, and are decoded by the decoder 4 (8–16 demodulation, de-interleaving and error correction decoding). The obtained old data are stored in the memory 8 so that they are precede the new data b (step S7).

Next, based on the block count n obtained at step S3 or S4, the processor 7 calculates the latest update position of the old data to be updated, i.e., the latest recording position of ECC block a, (this is also the first position of ECC block $a_{n+1}$), and moves the pickup 2 to the latest recording position (step S8). All the old data for ECC block $a_{n+1}$ that has been sequentially recorded following the latest recording position are read, and are decoded by the decoder 4. Then, the old data that are obtained are continuously recorded in the memory 8 following the new data b (or following 0s when the 0s are additionally stored at step S5) (step S9).

Following this, the processor 7 transmits, to the encoder 9, all the data stored in the memory 8, i.e., the old data for ECC block $a_0$ stored at step S7, the new data b for block count n, and the old data for ECC block $a_{n+1}$ stored at step S9. The processor 7 performs ECC encoding, i.e., constitutes an ECC data block by adding the ECC in-code 31 and the ECC out-code 32 and by performing interleaving and 8–16 modulation. Among the encoded data, the processor 7 stores in the buffer memory 10 of the encoder 9: the portion obtained by excluding the head portion including the ID information for ECC block $a_0$ (the portion, up to the 86th byte of the second data 41 in FIG. 2, having a total data volume of 177 bytes (91 bytes+86 bytes)), i.e., the data following the 87th byte of the second data 41; n ECC blocks (ECC block $b_1$ to ECC block $b_n$) corresponding to the new data b; and data corresponding to the above-described head portion, including the ID information for ECC block $a_{n+1}$, i.e., data up to the 86th byte of the second data 41 (step S10).

The processor 7 moves the pickup 2 to the first position for ECC block $a_0$ of the old data to be overwritten (step S11). The processor 7 controls the recording operation for the encoder 9, the power control circuit 11 and the laser drive circuit 12 in order to update and record, beginning at the position of the 178th byte of ECC block $a_0$ in this case, data that was stored in the buffer memory 10 of the encoder 9 at step S10 (step S12). The recording operation is repeated until all the data stored in the buffer memory 10 of the encoder 9 have been recorded (step S13).

Figure 5:
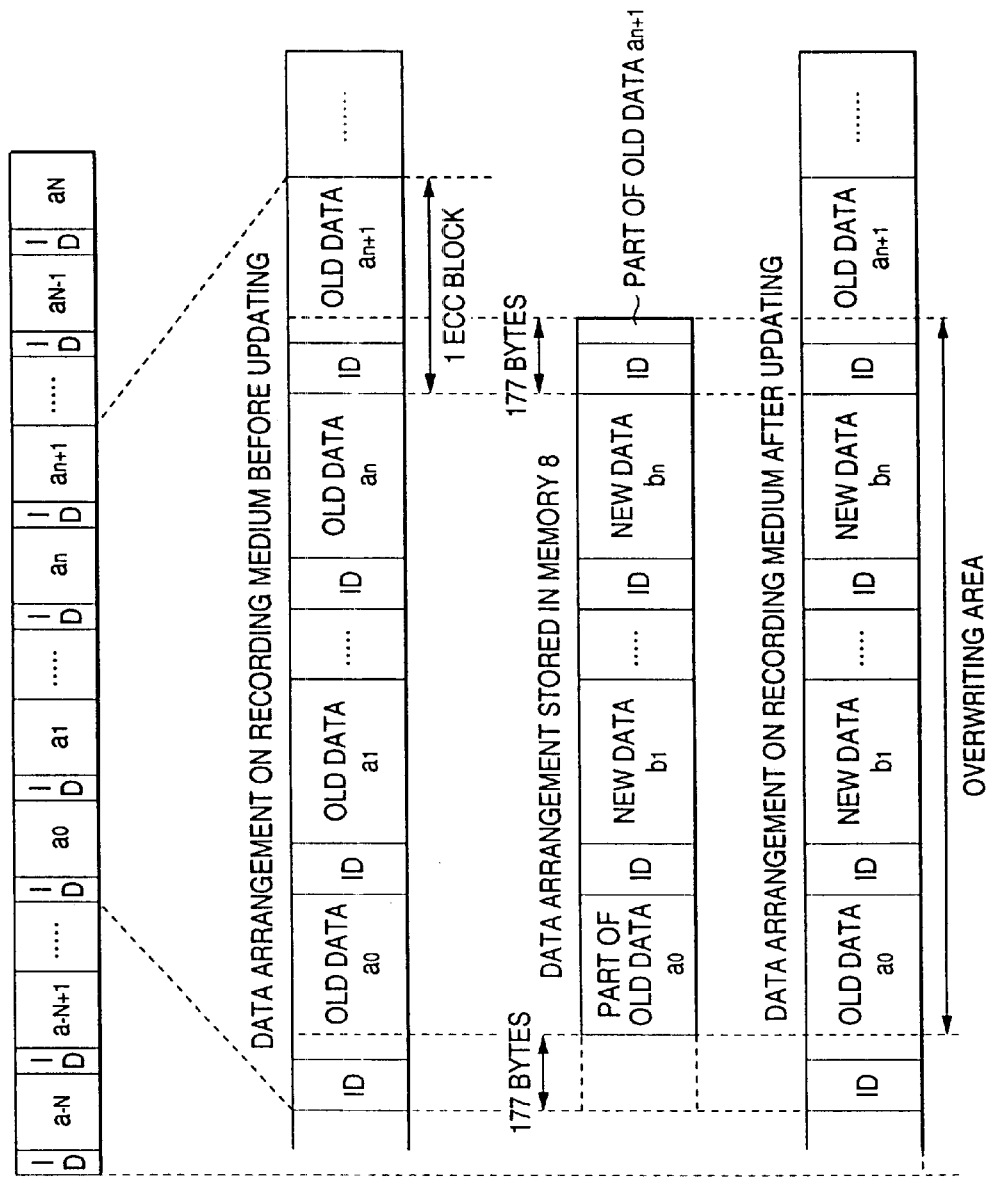
FIG. 5 is a diagram showing the state wherein the information is recorded in the information recording processing.

Through the above-described processing, as is shown in FIG. 5, ECC blocks $a_1$ to $a_n$ of the old data A that was originally to be updated are overwritten with the new data b. Then, old data (data following the sixth byte of the ECC in-code 31 that first appears in ECC block $a_0$) that precedes the old data to be updated and that should not be overwritten are updated using the old data (the contents are the same as those before the updating was performed) that are re-encoded at step S8. Further, the head portion (177 bytes, including the ID information, i.e., the portion up to the fifth byte of the ECC in-code 31 that first appears in ECC block $a_{n+1}$) of the ECC block $a_{n+1}$, which are old data that follows the new data b and that should not be updated, are updated by using old data (the data contents are the same as those before the updating was performed) that are re-encoded at step S10.

Therefore, the old data that was originally recorded and should not be overwritten is again recorded in the coupling portion (i.e., ECC block $a_0$ and ECC block $a_{n+1}$), so that it is possible to reduce the deterioration of the ECC block error correction capability for the coupling portion for which error correction encoding has been performed based on the old data that was originally recorded.

In this embodiment, the old data (ECC block $a_0$ and ECC block $a_{n+1}$) that are recorded again are so recorded that a specific portion (five bytes) of the ECC in-code 31 that first appears in each ECC block serves as either a start point or an end point. In this processing, when the time axis control for the spindle servo in the information recording apparatus S is poor in precision, the seam of each ECC block containing old data that are not updated does not match. Specifically, if one part of the old data that should not be updated is destroyed due to the data updating operation, the seam that is destroyed may be the area wherein the ECC in-code, i.e., so-called redundancy data, are recorded. Thus, if the data destruction due to the updating occurs in such an area, the precision for the data (corresponding to the data block 33 in FIG. 1(b)) that are to be recorded using the method of the present invention is improved. Therefore, compared with the conventional method according to which dummy data is recorded as data that corresponds to the data block 33, at the minimum the deterioration of the error correction capability in the direction of the ECC out-code array in the data block 33 can be reduced.

In this embodiment, at step S9, the old data that is to be recorded again (ECC block $a,+_1$ that contains old data that should not be updated) are read from the optical disk 1, and stored in the memory 8 in addition to the new data b, and at step S10, the stored data are encoded and the obtained data are recorded on the optical disk 1. The same effect can be obtained by performing a process whereby old data that are read and output by the reproduction amplifier 3 and that are decoded, i.e., the amplification signal $S_p$, for which 8–16 modulation is performed and that is supplied as an RF signal for ECC block $a_{n+1}$, is stored in the buffer memory 10 of the encoder 9, or a special memory, after the new data b that are encoded have been recorded on the optical disk 1. In this case, at step S9, reading of all the old data in ECC block $a_{n+1}$ is not required, and only the data volume that corresponds to the portion (five bytes) of the ECC in-code that first appears in ECC block $a_{n+1}$ must be read.

As described above, according to the present invention, an information recording method, whereby new digital information is employed to update a part of old digital information that has been recorded on an information recording medium and that has been separated by adding for each error correction unit control information that has been determined in advance, includes: a latest update location detection step of employing the volume of the new digital information to detect the latest update position of the old digital information on the recording medium that is to be updated; an information reading step of reading a predetermined volume of old digital information that has been recorded following the latest update position detected; and a recording step of sequentially recording, after the new digital information is recorded, a part, which at the least includes the control information, of the old digital information of the predetermined volume that has been read at the information reading step. Therefore, the old data that should have been originally recorded are recorded again at the portions (e.g., ECC block $a_0$ and ECC block $a_{n+1}$) where the updated new data b and the old data a are coupled together. Therefore, it is possible to reduce the deterioration of the error correction capability for an ECC block that includes the above coupled portion for which, based on the old data that should have been originally recorded, error correction encoding has been performed.

What is claimed is:

1. An information recording method, whereby new digital information is employed to update a part of old digital information that has been recorded on an information recording medium and that has been separated by adding for each error correction unit control information that has been determined in advance, comprising:

a latest update location detection step of employing the volume of the new digital information to detect the latest update position on the recording medium for the old digital information that is to be updated;

an information reading step of reading a predetermined volume of old digital information that has been recorded following the latest update position detected; and a recording step of sequentially recording, following the recording of the new digital information, a part, which at least includes the control information, of the predetermined volume of the old digital information that has been read at said information reading step.

2. The information recording method according to claim 1, wherein the predetermined volume is a data volume corresponding to the error correction unit.

3. The information recording method according to claim 2, wherein said recording step includes:

an error correction and decoding step of performing error correction and decoding for the old digital information read at said information reading step; and an error correction and encoding step of again performing error correction and encoding for the old digital information obtained at said error correction and decoding step, wherein a part of the old digital information obtained at said error correction and encoding step is recorded.

4. The information recording method according to claim 1, further comprising:

a second information reading step of, before the updating and the recording of the new digital information, reading old digital information for one error correction unit at a position of the recording medium that precedes, by a volume of information equivalent to the one error correction unit, an update start position at which the updating of the new digital information is begun; and a second recording step of, before the new digital information is recorded, updating and recording old digital information, which is obtained by removing, from the old digital information read at said second information reading step, a part of the digital information that includes at least the control information, at a recording position on the recording medium corresponding to that of the pertinent old digital information, wherein the new digital information is sequentially recorded following the recording and updating of the old digital information at said second recording step.

5. An information recording apparatus, in which new digital information is employed to update a part of old digital information that has been recorded on an information recording medium and that has been separated by adding for each error correction unit control information that has been determined in advance, comprising:

latest update location detection means for employing the volume of the new digital information to detect the latest update position on the recording medium for the old digital information that is to be updated;

information reading means for reading a predetermined volume of old digital information that has been recorded following the latest update position detected; and recording means for sequentially recording, following the recording of the new digital information, a part, which at least includes the control information, of the predetermined volume of the old digital information that has been read by said information reading means.

6. The information recording apparatus according to claim 5, wherein the predetermined volume is a data volume corresponding to the error correction unit.

7. The information recording apparatus according to claim 6, wherein said recording means includes:

error correction and decoding means for performing error correction and decoding for the old digital information read by said information reading means; and error correction and encoding means for again performing error correction and encoding for the old digital information obtained by said error correction and decoding means, wherein a part of the old digital information obtained by said error correction and encoding means is recorded.

* * * * *